United States Patent
Perng et al.

(10) Patent No.: US 9,130,059 B2
(45) Date of Patent: Sep. 8, 2015

(54) METHOD OF FABRICATING A SEMICONDUCTOR DEVICE HAVING A CAPPING LAYER

(71) Applicant: TAIWAN SEMICONDUCTOR MANUFACTURING COMPANY, LTD., Hsin-Chu (TW)

(72) Inventors: Tsu-Hsiu Perng, Zhubei (TW); Zhao-Cheng Chen, New Taipei (TW); Chun-Hsiang Fan, Longtan Township, Taoyuan County (TW); Ming-Huan Tsai, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 55 days.

(21) Appl. No.: 13/744,996

(22) Filed: Jan. 18, 2013

(65) Prior Publication Data

US 2014/0206161 A1    Jul. 24, 2014

(51) Int. Cl.
*H01L 21/8238*    (2006.01)
*H01L 29/49*    (2006.01)
*H01L 29/51*    (2006.01)
*H01L 29/66*    (2006.01)
*H01L 29/78*    (2006.01)
*H01L 29/10*    (2006.01)

(52) U.S. Cl.
CPC ...... *H01L 21/823807* (2013.01); *H01L 21/823828* (2013.01); *H01L 29/1054* (2013.01); *H01L 29/4966* (2013.01); *H01L 29/517* (2013.01); *H01L 29/66545* (2013.01); *H01L 29/7843* (2013.01)

(58) Field of Classification Search
CPC .................................................. H01L 29/66545
See application file for complete search history.

(56) References Cited

U.S. PATENT DOCUMENTS

2010/0258869 A1*  10/2010  Morita et al. ................. 257/347
2011/0081774 A1*  4/2011  Yeh et al. ...................... 438/591

* cited by examiner

*Primary Examiner* — Seahvosh Nikmanesh
(74) *Attorney, Agent, or Firm* — Haynes and Boone, LLP

(57) ABSTRACT

A method of semiconductor device fabrication includes forming a first dummy gate structure in a first region of a semiconductor substrate and forming a second dummy gate structure in a second region of the semiconductor substrate. A protective layer (e.g., oxide and/or silicon nitride hard mask) is formed on the second dummy gate structure. The first dummy gate structure is removed after forming the protective layer, thereby providing a first trench. A capping layer (e.g., silicon) is formed in the first trench. A metal gate structure may be formed on the capping layer. The protective layer may protect the second dummy gate structure during the removal of the first dummy gate structure.

20 Claims, 14 Drawing Sheets

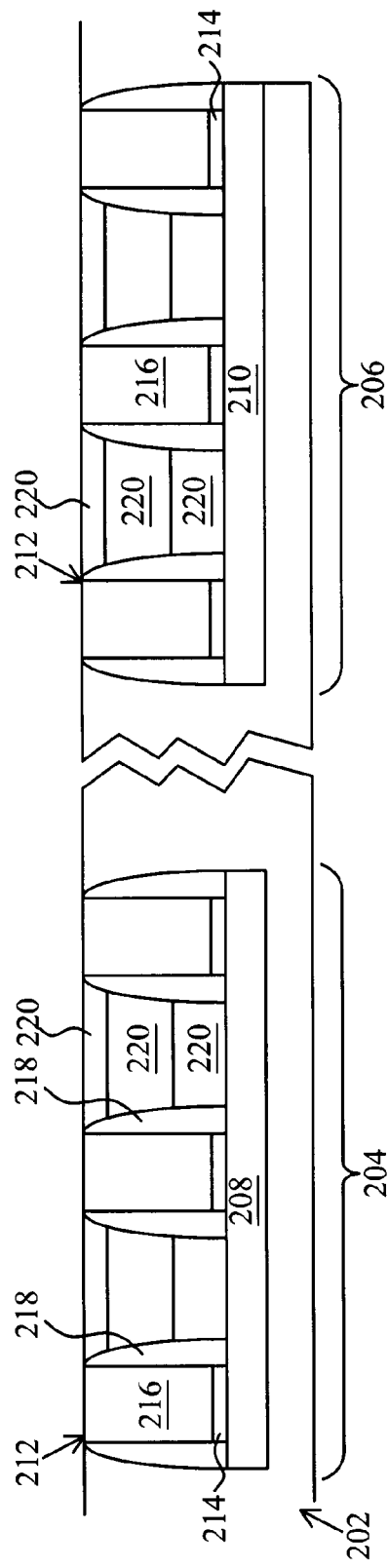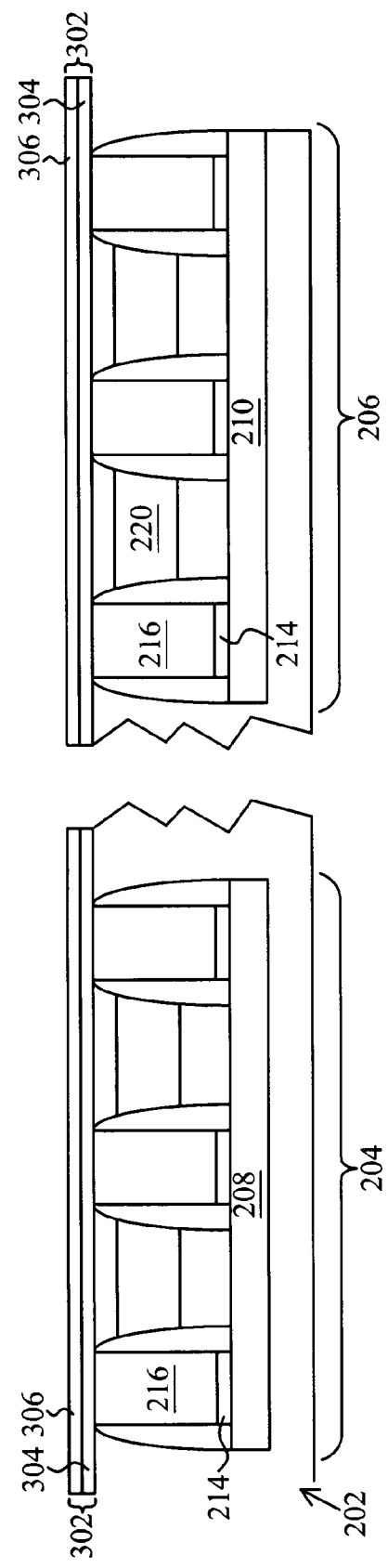

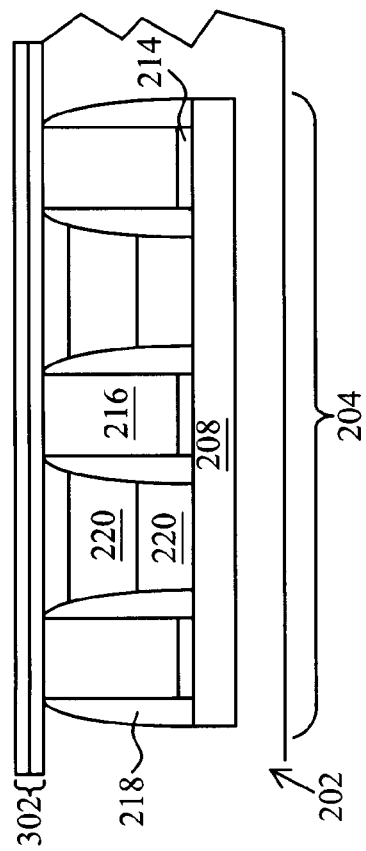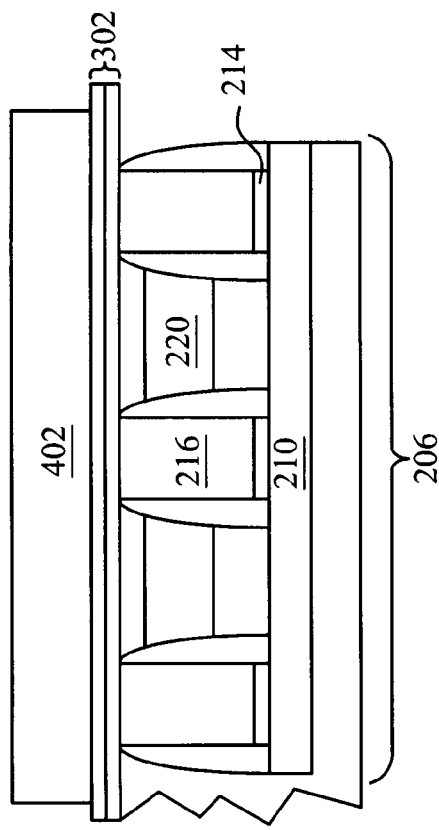
FIG. 4
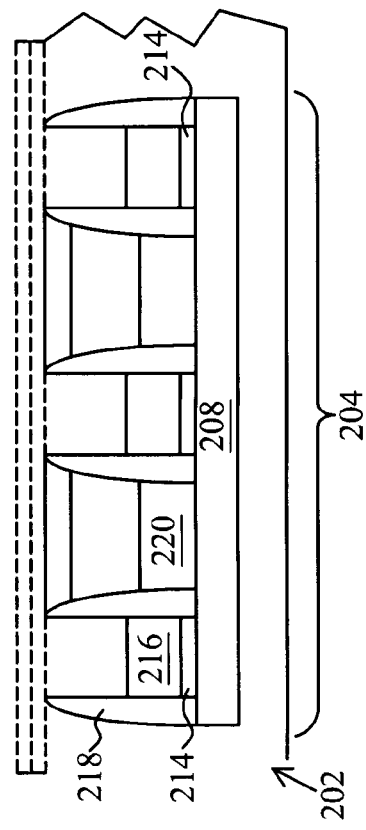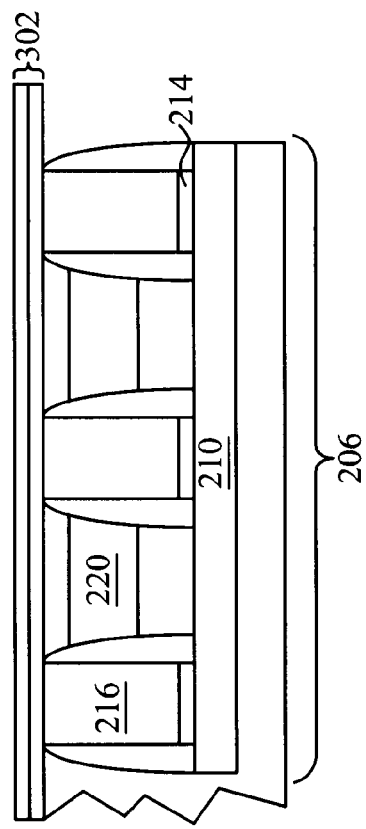
FIG. 5

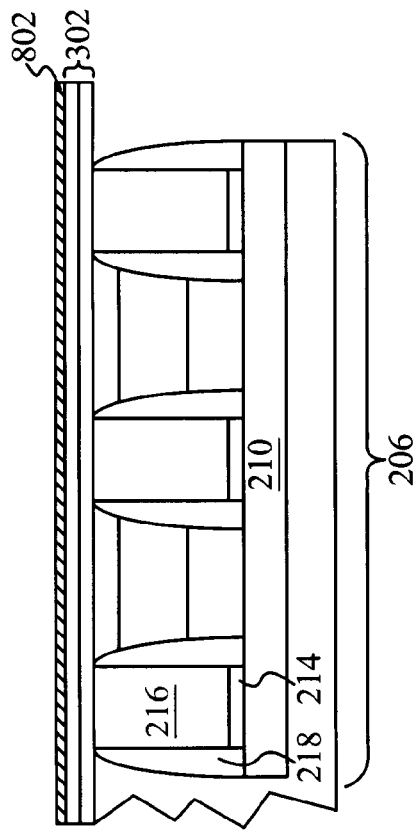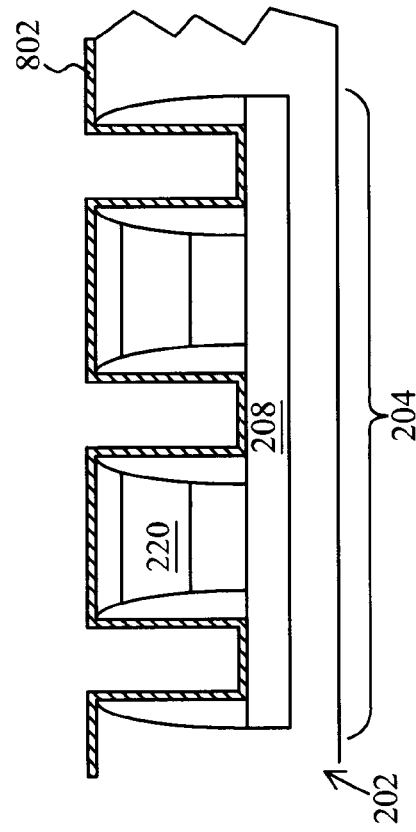
FIG. 8
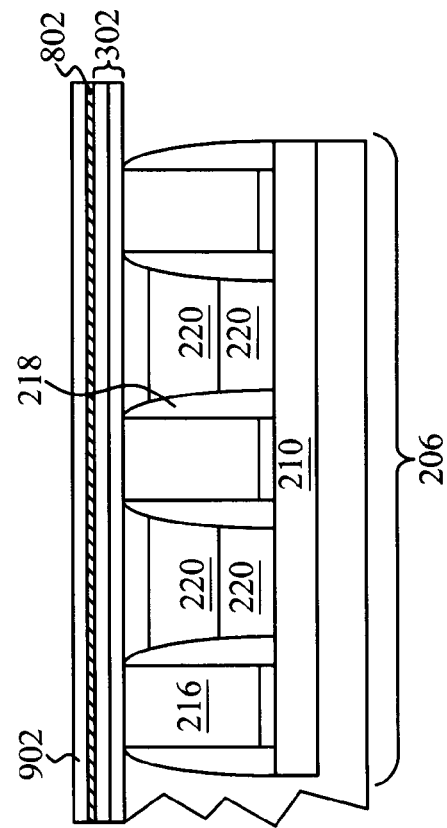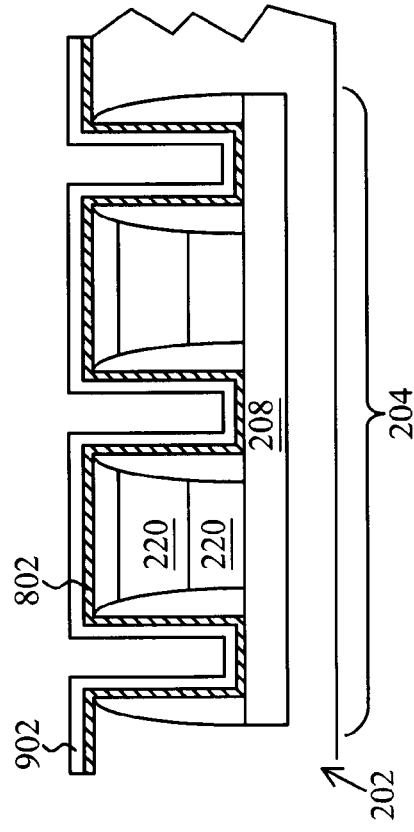
FIG. 9

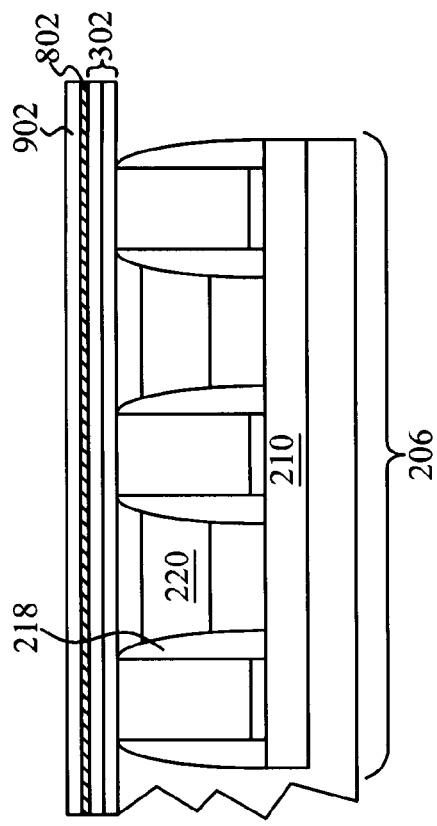
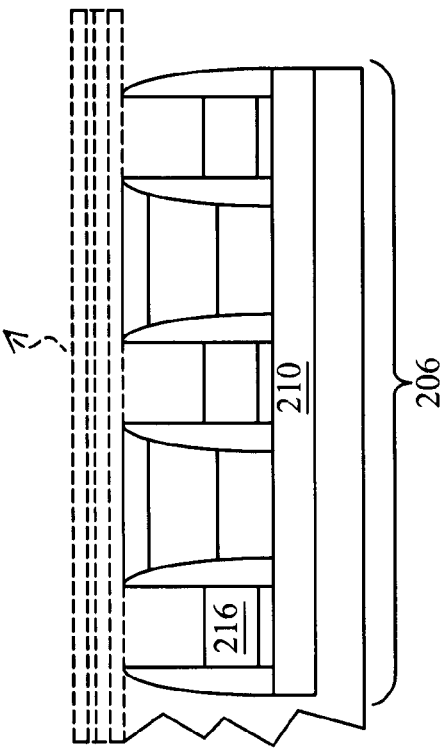
FIG. 10
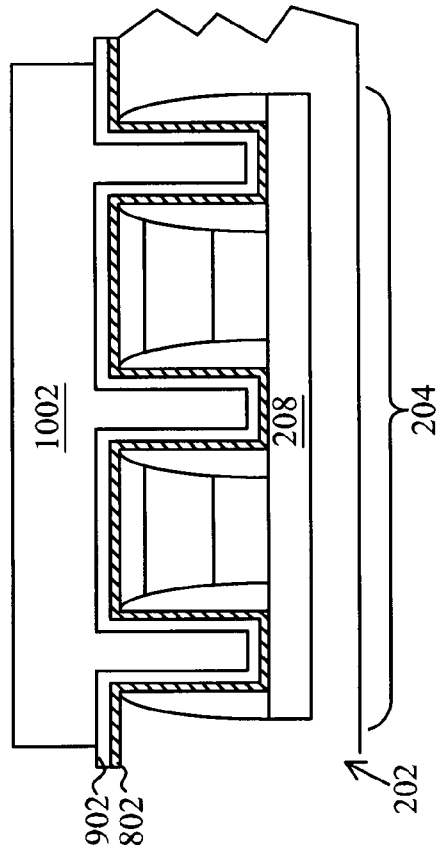
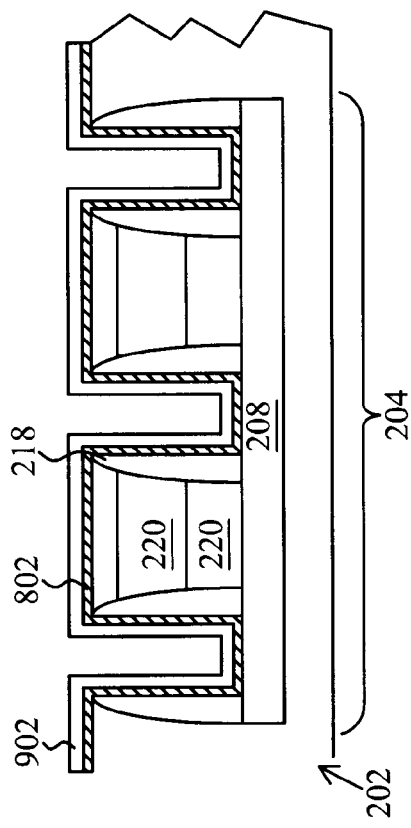
FIG. 11

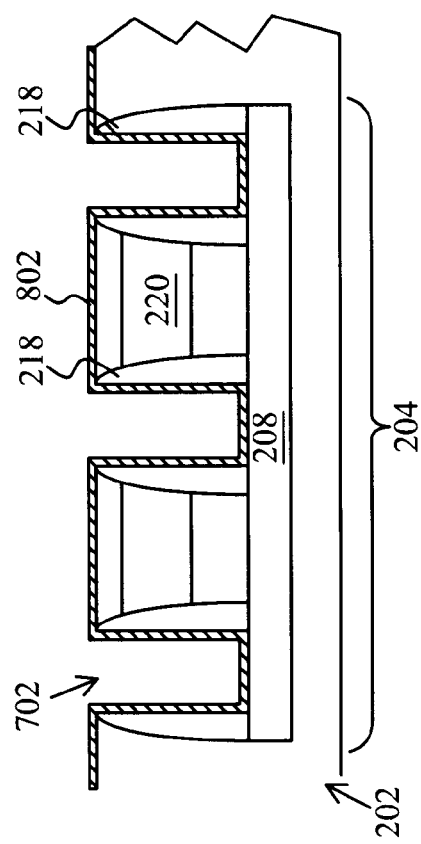
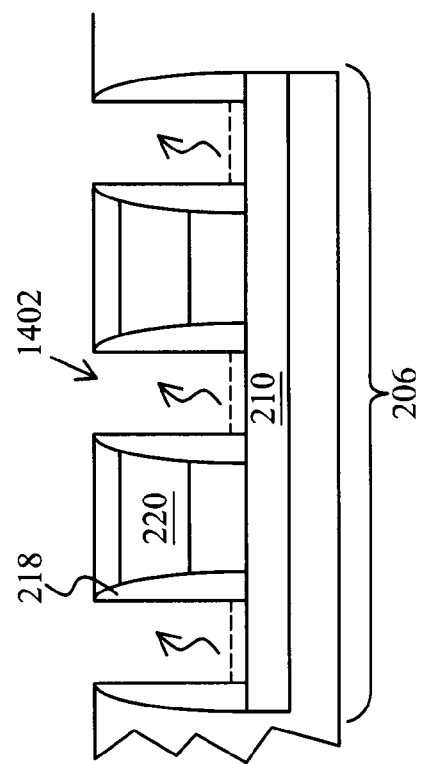
FIG. 14
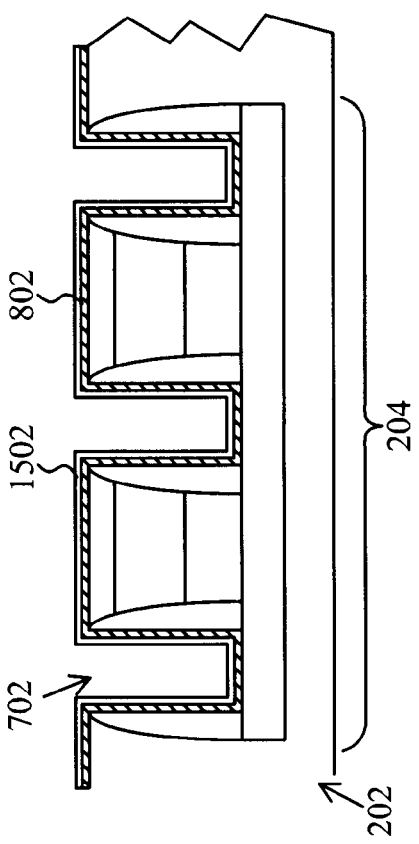
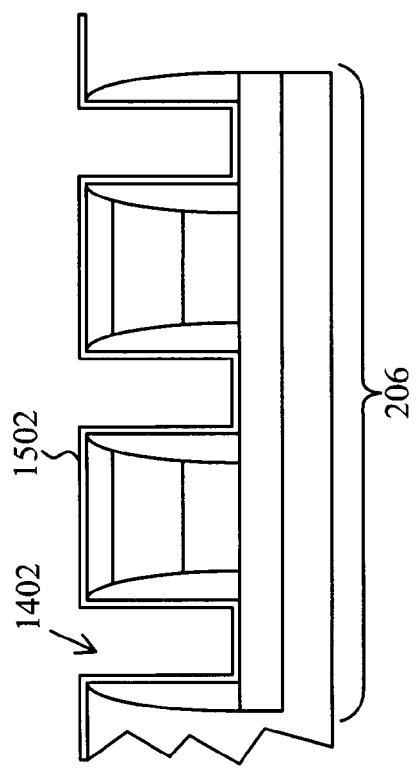
FIG. 15

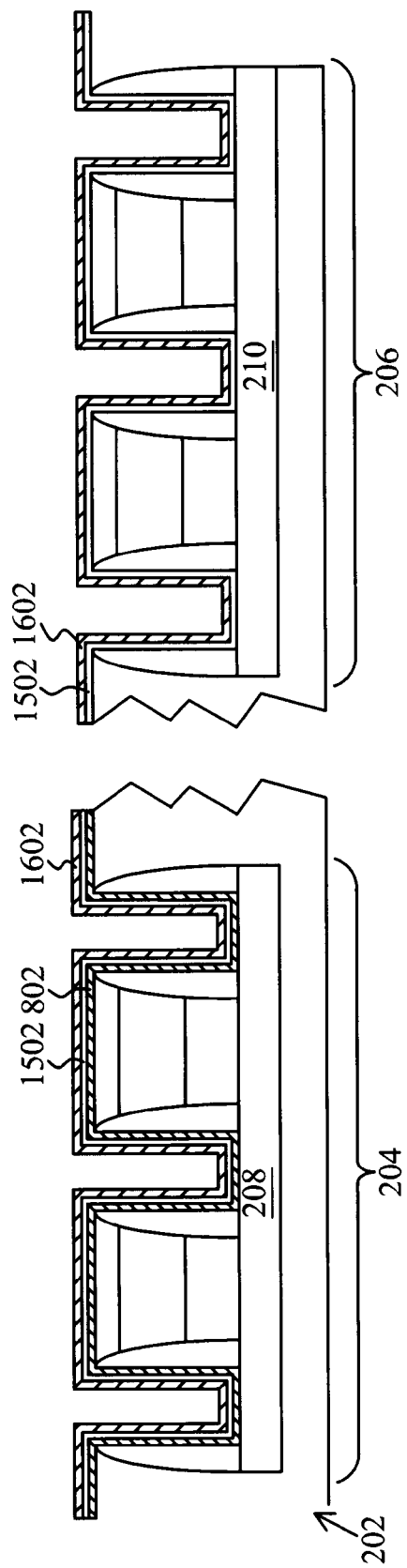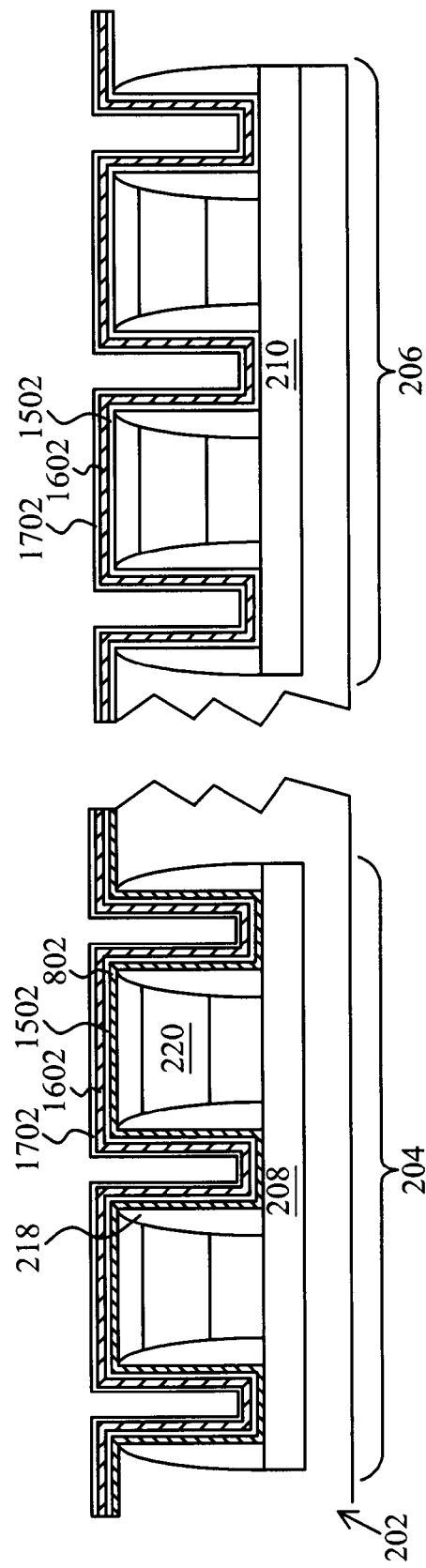
FIG. 16
FIG. 17

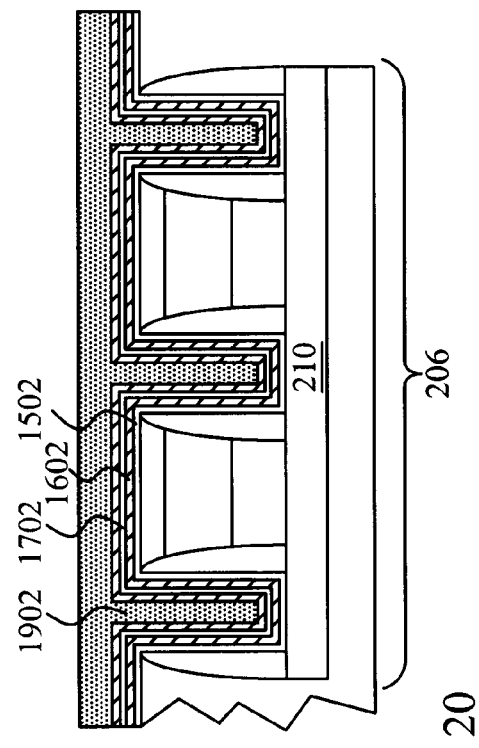
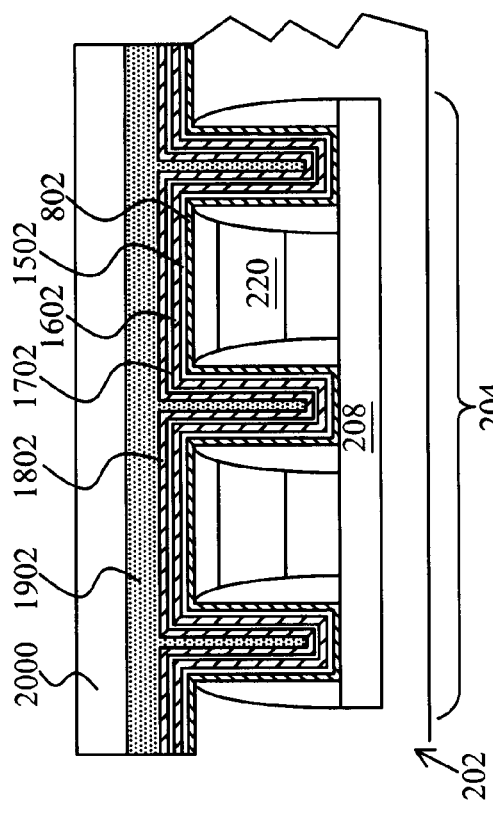
FIG. 20
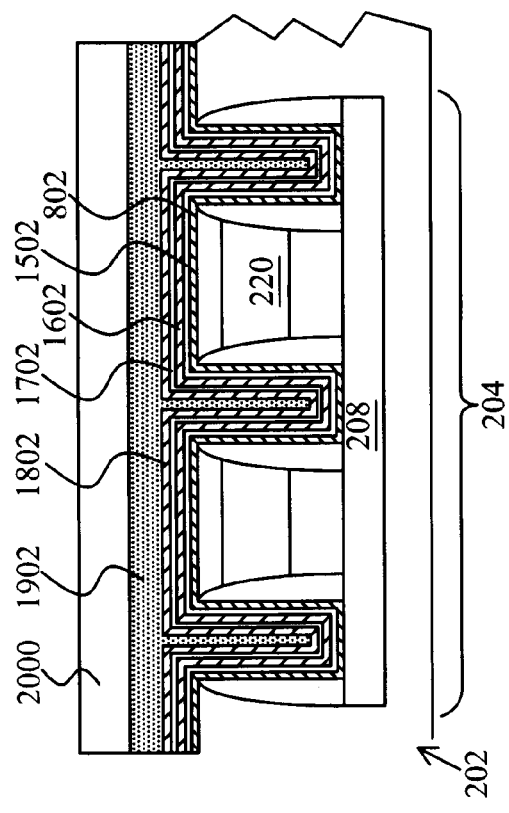
FIG. 21

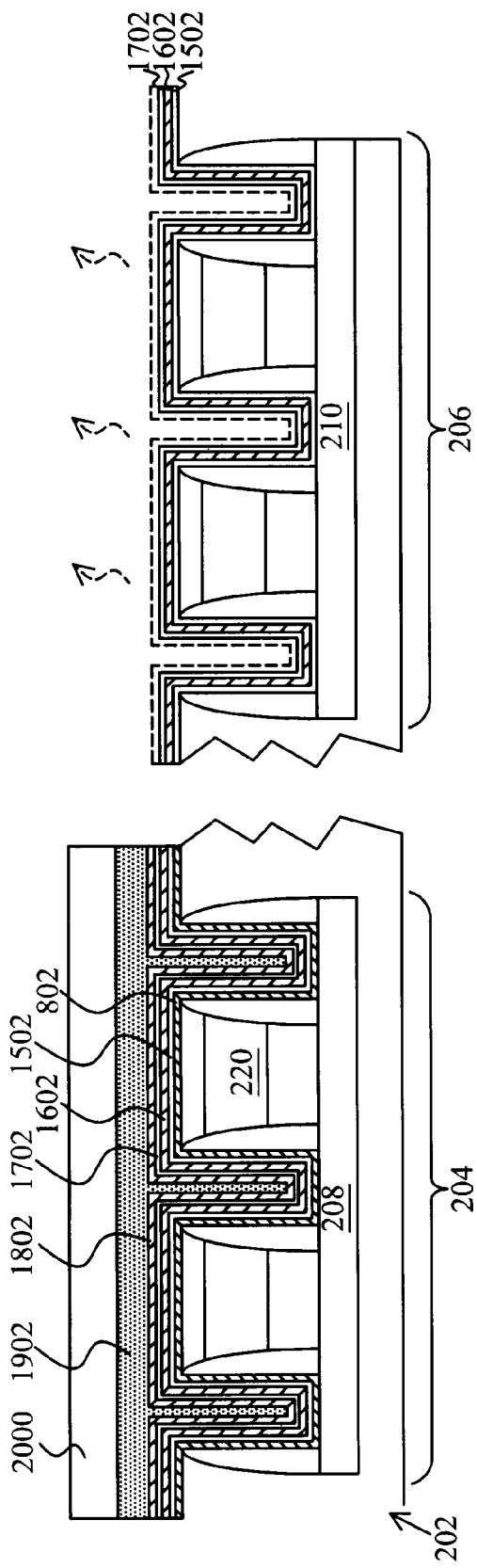
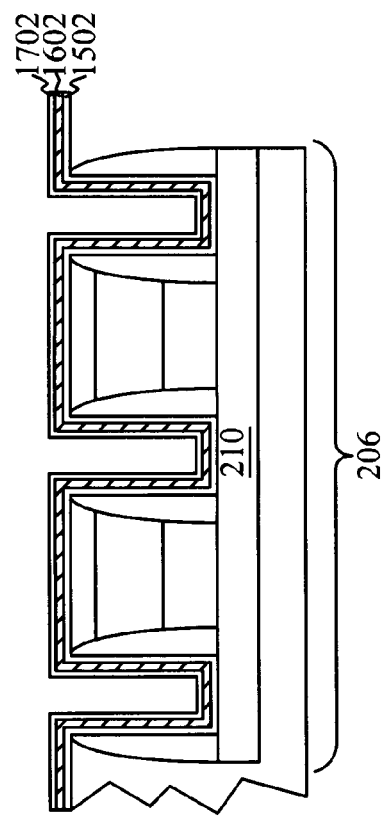
FIG. 22
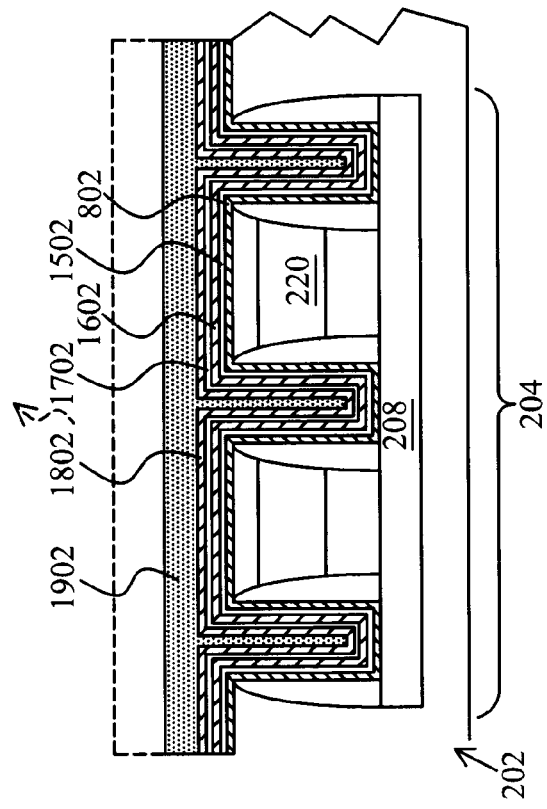
FIG. 23

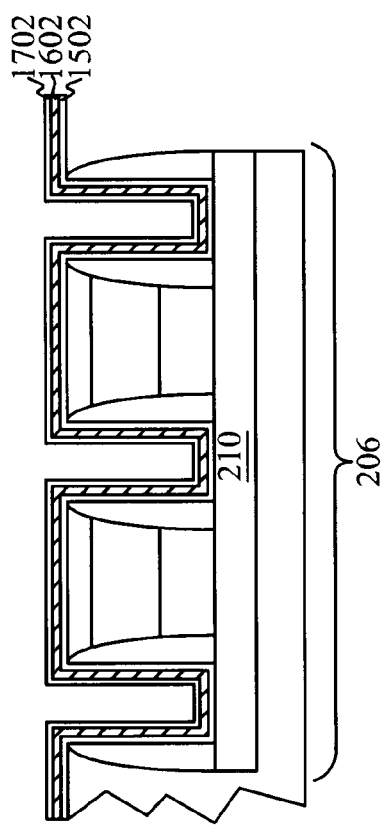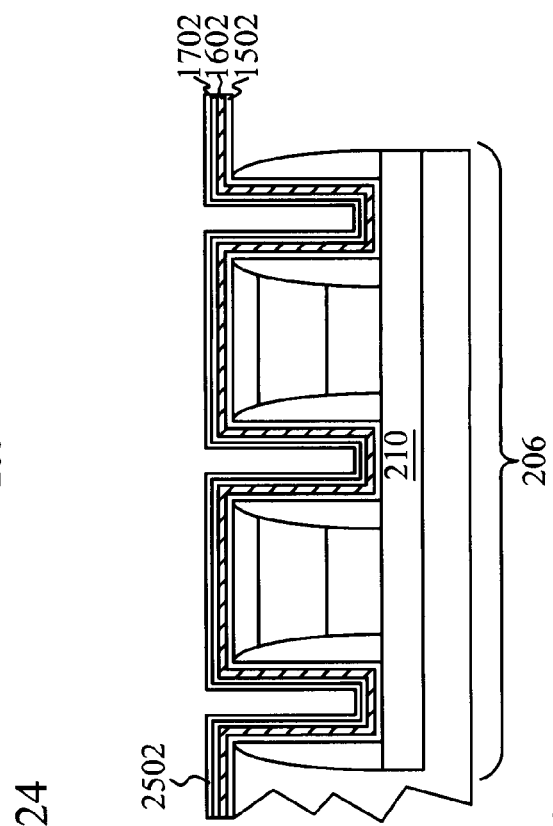
FIG. 24
FIG. 25

METHOD OF FABRICATING A SEMICONDUCTOR DEVICE HAVING A CAPPING LAYER

BACKGROUND

The semiconductor integrated circuit (IC) industry has experienced rapid growth. Technological advances in IC materials, design, and fabrication tools have produced generations of ICs where each generation has smaller and more complex circuits than the previous generation. In the course of these advances, fabrication methods and materials have been developed to realize the desire for smaller feature sizes.

One development being considered for the enhanced performance of devices is the use of silicon germanium to form the channel of some devices such as PMOS field effect transistors (PFET devices), while silicon is maintained for the use of NMOS field effect transistors (NFET devices). Intermixing device types on the same substrate provides challenges in their integration however. For example, materials that may benefit one device type may be detrimental to another device type. Thus, methods that adequately address multiple device types on a single substrate while maintaining or increasing the performance are desired.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 2-27 are cross-sectional views of an embodiment of a semiconductor device fabricated according to one or more steps of the method of FIG. 1

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the illustrations, features depicted in dashed lines indicates their removal from the substrate.

Figure 1:
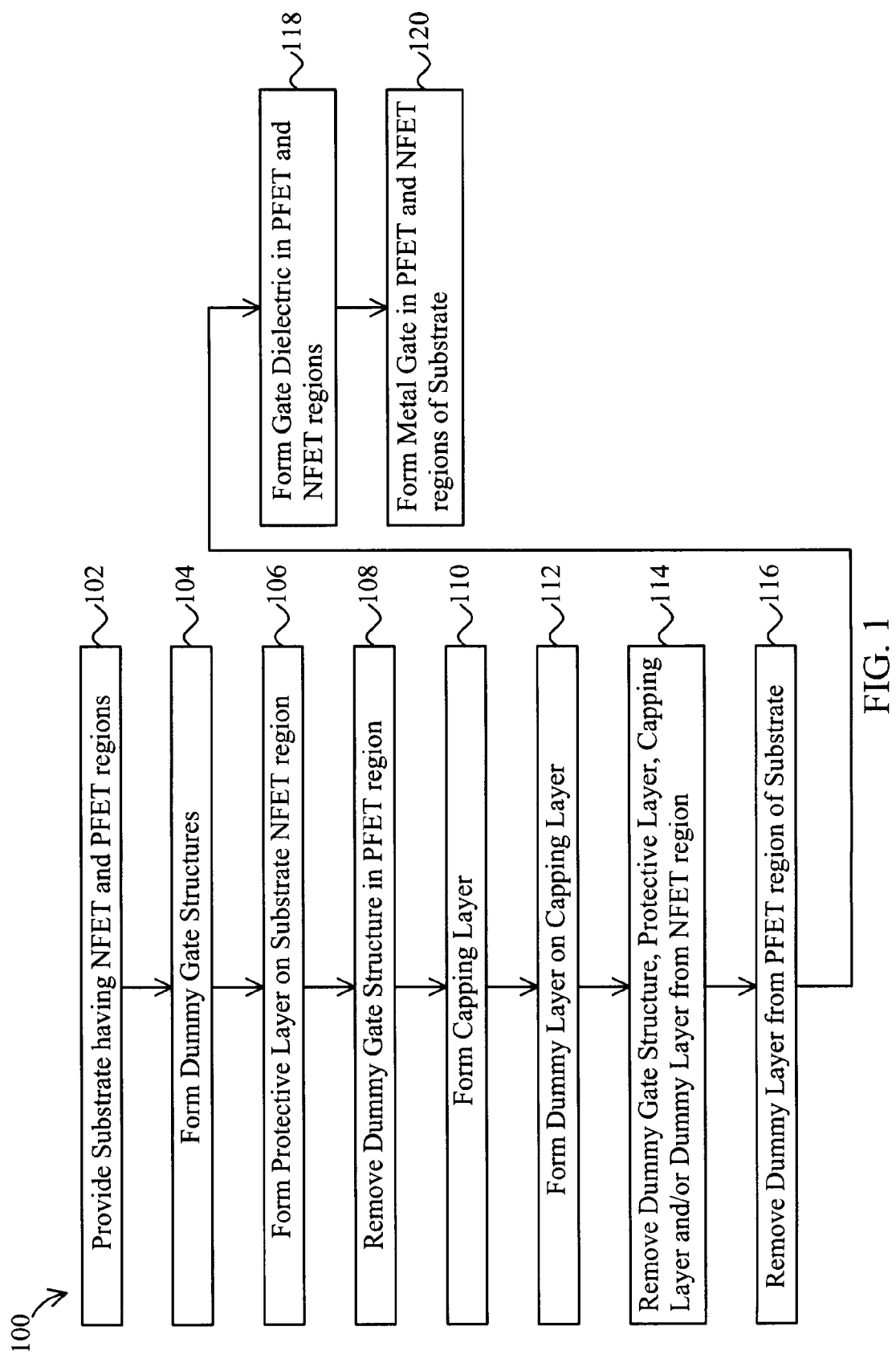
FIG. 1 is a method of semiconductor device fabricating according to one or more aspects of the present disclosure.

Illustrated in FIG. 1 is a method 100 of semiconductor fabricating according to one or more aspects of the present disclosure. FIGS. 2-27 are cross-sectional embodiments of a semiconductor device according to the method 100 of FIG. 1.

It is understood that the method 100 includes steps having features of a complementary metal-oxide-semiconductor (CMOS) technology process flow and thus, are only described briefly herein. Additional steps may be performed before, after, and/or during the method 100. It is also understood that parts of the semiconductor devices of FIGS. 2-27 may be fabricated by complementary metal-oxide-semiconductor (CMOS) technology process flow, and thus some processes are only briefly described herein. Further, these devices of FIGS. 2-27 may include various other devices and features, such as additional transistors, bipolar junction transistors, resistors, capacitors, diodes, fuses, etc., but are simplified for a better understanding of the inventive concepts of the present disclosure. These devices may also include a plurality of semiconductor devices (e.g., transistors), which may be interconnected. The devices may be intermediate devices fabricated during processing of an integrated circuit, or portion thereof, that may comprise static random access memory (SRAM) and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof. It is noted that the illustrated devices provide a single device in each of two regions, however, this configuration is for illustrative purposes only and not intended to limit the disclosure to any number of gate structures.

The method 100 begins at block 102 where a substrate having a first region and second region is provided. The first region is an NFET region; the second region is a PFET region. The NFET region is a region of the substrate wherein an n-type field effect transistor is formed or is to be formed. The PFET region is a region of the substrate wherein a p-type field effect transistor is formed or is to be formed. An isolation region such as a shallow trench isolation structure (STI) or a local-oxidation-of-silicon (LOCOS) structure may interpose the regions.

The substrate may be a semiconductor substrate (e.g., wafer). The substrate may be a silicon substrate. Alternatively, the substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In one embodiment, the substrate is a semiconductor on insulator (SOI) substrate.

In an embodiment, the first region of the substrate includes a silicon germanium region where the device (e.g., PFET) is to be formed (e.g., an active region). In an embodiment, the second region of the substrate includes a silicon region where the device (e.g., NFET) is to be formed (e.g., an active region).

Referring to the example of FIG. 2, a substrate 202 is provided. The substrate 202 includes a PFET region 204 and an NFET region 206. The PFET region 204 includes a silicon germanium active region 208. The NFET region 206 includes a silicon active region 210.

The method 100 then proceeds to block 104 where dummy gate structures are formed. The dummy gate structures are disposed on the substrate in each of the two regions. Each dummy gate structure includes at least one sacrificial layer. For example, a dummy gate structure may include an interface layer (IL), a gate dielectric layer, a dummy gate electrode layer, and/or other suitable layers that are subsequently removed. In an embodiment, the IL may include a dielectric material such as silicon oxide layer ($SiO_2$) or silicon oxynitride (SiON). The IL may be formed by chemical oxidation, thermal oxidation, atomic layer deposition (ALD), chemical vapor deposition (CVD), and/or other suitable method. In an embodiment, the gate dielectric layer includes an oxide such as SiO$_2$. The dielectric layer may be formed by thermal oxidation, atomic layer deposition (ALD) and/or other suitable methods. In an embodiment, the dummy gate electrode layer includes polysilicon and/or other suitable material. The dummy gate electrode layer may be formed by CVD, physical vapor deposition (PVD), ALD, other suitable methods, and/or combinations thereof.

The dummy gate structure can be formed by a procedure including depositing material(s) and patterning and etching processes to form a gate stack from the materials. A photolithography patterning processes may be used including photoresist coating (e.g., spin-on coating), soft baking, mask aligning, exposure, post-exposure baking, developing the photoresist, rinsing, drying (e.g., hard baking), other suitable processes, and/or combinations thereof. The etching processes include dry etching, wet etching, and/or other etching methods (e.g., reactive ion etching).

In embodiments, spacer elements may be formed abutting the sidewalls of the dummy gate structure prior to or after the formation of the source/drain regions (or portions thereof). The spacer elements may be formed by depositing a dielectric material followed by an isotropic etching process, however other embodiments are possible. In an embodiment, the spacer elements include silicon oxide, silicon nitride, and/or other suitable dielectrics. The spacer elements may include a plurality of layers.

The method 100 may also include forming additional features. In one embodiment, source/drain regions are formed. The source/drain regions may include the introduction of suitable dopant types: n-type or p-type dopants. The source/drain regions may include halo or low-dose drain (LDD) implantation, source/drain implantation, source/drain activation and/or other suitable processes. In other embodiments, the source/drain regions may include raised source/drain regions, strained regions, epitaxially grown regions, and/or other suitable techniques.

In an embodiment, a contact etch stop layer (CESL) and an interlayer dielectric (ILD) layer are formed on and around the dummy gate structure(s). Examples of materials that may be used to form CESL include silicon nitride, silicon oxide, silicon oxynitride, and/or other materials known in the art. The ILD layer may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer may be deposited by a PECVD process or other suitable deposition technique.

Referring to the example of FIG. 2, dummy gate structures 212 are disposed on the substrate. The dummy gate structures 212 include a dummy dielectric layer 214 and a dummy electrode layer 216. In an embodiment, the dummy dielectric layer 214 is an oxide such as silicon oxide. In an embodiment, the dummy electrode layer 216 is polysilicon. Spacer elements 218 are disposed on the sidewalls of the dummy gate structures 212. ILD layers 220 interpose the dummy gate structures 212. The ILD layer 220 may include a plurality of layers. The layers may have the same or differing compositions.

The method 100 then proceeds to block 106 where a protective layer (or hard mask) is formed on the substrate in the NFET region. In an embodiment, the protective layer is formed on both the first and second region (e.g., a blanket or conformal coating layer). The protective layer is then patterned using suitable patterning techniques such as photolithography to provide the protective layer on the NFET region and, for example, not on the PFET region as further illustrated below with reference to FIGS. 3-5. In an embodiment, the protective layer includes a plurality of layers. For example, in an embodiment, the protective layer includes an oxide layer (e.g., SiO$_2$) and a silicon nitride (SiN) layer. However, other compositions providing the suitable etch resistance (as discussed below with reference to FIGS. 6 and 7) are possible. In an embodiment, only a silicon nitride layer is provided as a protection layer. The protective layer may be provided by suitable formation techniques such as, chemical vapor deposition (CVD), physical vapor deposition (PVD), atomic layer deposition (ALD), oxidation processes, and/or other suitable processes.

Referring to the example of FIG. 3, a protective layer 302 is provided on the substrate 202. The protective layer 302 includes a first layer 304 and a second layer 306. In an embodiment, the first layer 304 is an oxide (e.g., SiO$_2$). In an embodiment, the second layer 306 is silicon nitride. The protective layer 302 may also be referred to as a hard mask material. In an embodiment, the first layer 304 is omitted.

Continuing now to the example of FIG. 4, a masking element 402 is formed on the NFET region 206 of the substrate 202. In an embodiment, the masking element 402 includes photosensitive material. The masking element 402 may be formed by suitable processes such as spinning on the photosensitive material (also referred to herein as resist), exposure to a pattern of radiation, soft bake, development, hard baking, rinse processes, and/or other suitable processes.

Continuing now to the example of FIG. 5, the removal of the protective layer 302 is illustrated. The masking element 402 is also removed. The masking element 402 may be removed after and/or concurrently with the removal of the protective layer 302 from the PFET region 204. The protective layer 302, and/or masking element 402, may be removed by etching processes such as wet etch, dry etch, plasma etch, ashing, and/or other suitable processes. The removal may be provided in one or more etching steps. It is noted that portion of the dummy gate electrode 216 may also be removed during the removal of the protective layer 302 from the PFET region 204.

The method 100 then continues to block 108 where a dummy gate structure is removed from the first region (e.g., PFET region) to provide a trench or opening. The dummy gate structure may be removed by suitable wet and/or dry etching processes.

Figure 6:
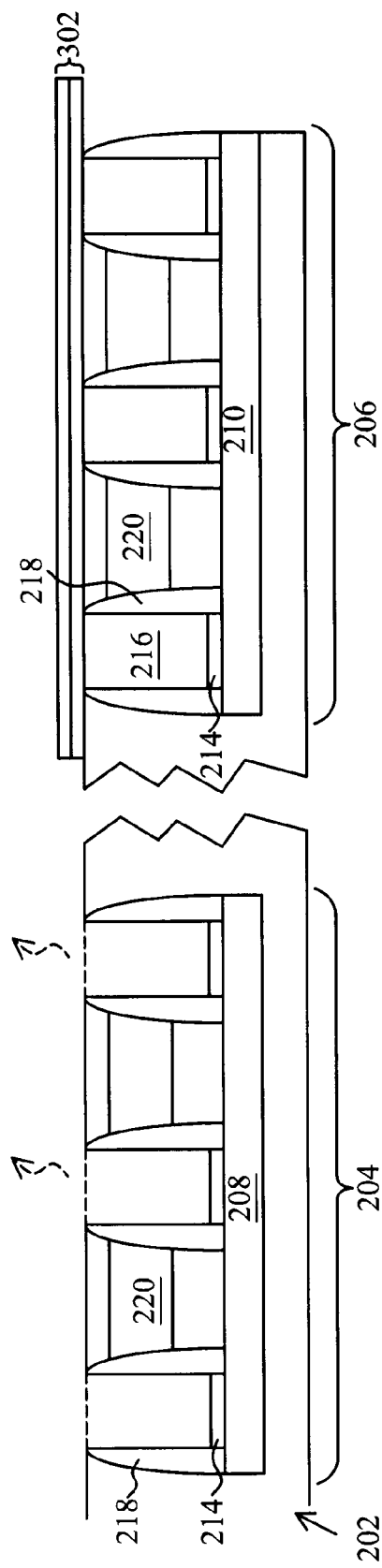
Figure 7:
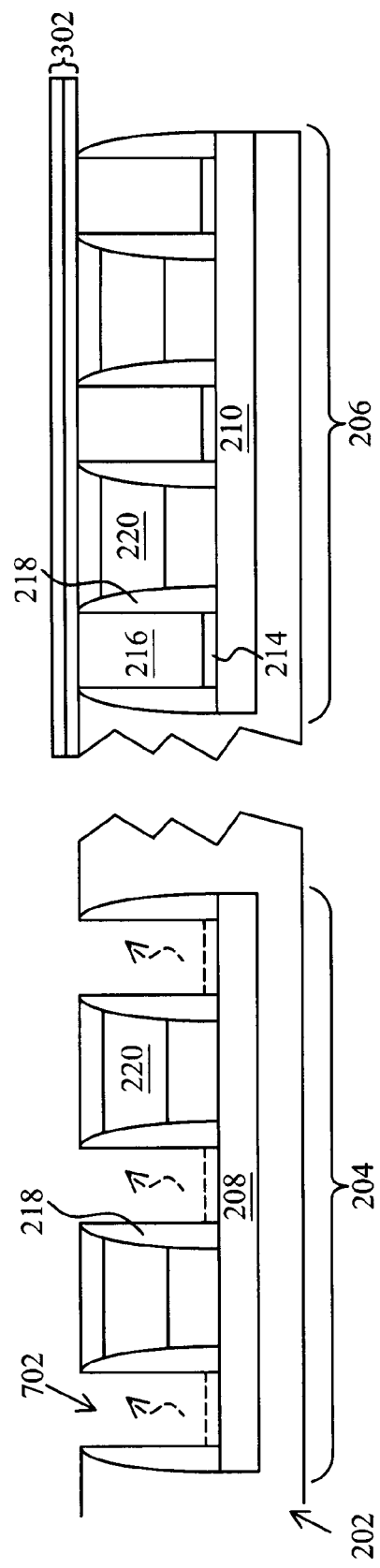

Referring to the example of FIG. 6, the remaining dummy gate electrode 216 of the dummy gate structure 212 in the PFET region 204 of the substrate 202 is removed. The dummy gate electrode 216 may be removed by suitable wet and/or dry etching processes. Continuing to the example of FIG. 7, the dummy gate dielectric layer 214 of the dummy gate structure 212 in the PFET region 204 of the substrate 202 is removed. The dummy gate dielectric 214 may also be removed by suitable wet and/or dry etching processes. The removal of the dummy gate structure 212 provides a trench 702.

It is noted that during the removal of the dummy gate structure in the PFET region, the protective layer is provided over the dummy gate structures in the NFET region thereby preventing their removal. Thus, the protective layer composition (e.g., top layer composition) should be selected such that it is not significantly etched by the processes used to remove the dummy gate structure from the PFET region. For example, the materials may be selected for their resistance to etching (or etch selectivity) of polysilicon, oxide, or other materials of the dummy gate structures.

The method 100 then proceeds to block 110 where a capping layer is formed on the substrate. In an embodiment, the capping layer is a silicon layer. In a further embodiment, the capping layer is substantially pure silicon. In an embodiment, the capping layer is formed by an epitaxial process. The capping layer is formed such that it is disposed on the substrate in the trench formed in the PFET region by the removal of the dummy gate structures. Specifically, the capping layer may be formed on a bottom of the trench, for example, on the underlying substrate. In some embodiment, the capping layer is a conformal coating formed on the NFET and PFET regions. The thickness of the capping layer may range between approximately 1 nanometer (nm) and approximately 3 nm, by way of example. The thickness of the capping layer may be selected based on physical limitations of forming the layer, adequately and accurately filling the trench, and the desired performance of the device. In an embodiment, the thickness of the capping layer is dependent upon the desired threshold voltage (Vth) of the PFET device.

Referring to the example of FIG. 8, a capping layer 802 is formed on the substrate 202. The capping layer 802 is formed as a conformal layer provided on the PFET region 204 and the NFET region 206. However, other embodiments are possible such that the capping layer is formed on the bottom of the trench 702.

The capping layer may provide a stress to the channel region of the PFET device. This can provide performance enhancement for the PFET device. In an embodiment, the capping layer is omitted from the NFET device channel region and thus, does not impact the performance of the NFET.

The method 100 then continues to block 112 where a dummy layer is formed on the substrate including on the capping layer, described above with reference to block 110. In an embodiment, the dummy layer is silicon nitride. The dummy layer may be other suitable materials including dielectric materials. The dummy layer may be deposited by CVD, PVD, ALD, and/or other suitable process.

Referring to the example of FIG. 9, a dummy layer 902 is disposed on the substrate 202 including on the capping layer 802. In an embodiment, the dummy layer 902 is SiN.

The method 100 then proceeds to block 114 where the dummy gate structure, protective layer, capping layer and/or dummy layer are removed from the NFET region. The layers may be removed using suitable processes such as providing a masking element on the PFET region and performing etching processes to remove the layers on the NFET region. The masking element may include a photosensitive material such as photoresist and be formed using processes such as typical photolithography processes of exposure, soft baking, developing, etc.

Referring to the example of FIG. 10, a masking element 1002 is formed on the PFET region 204. In an embodiment, the masking element 1002 includes photosensitive material. The masking element 1002 may be formed by suitable processes such as spinning on the resist, exposure to a pattern of radiation, soft bake, development, hard baking, rinse processes, and/or other suitable processes.

Continuing to the example of FIG. 11, the protective layer 302, the capping layer 802, and the dummy layer 902 are removed from the NFET region 206 using one or more suitable etching techniques such as wet etching, dry etching, plasma etching, ashing, and the like. The masking element 1002 may be removed from the PFET region 204 concurrently with or subsequent to the removal of the layers 302, 802, and/or 902. It is noted that the removal of the layers 302, 802, and/or 902 and/or the ashing of the masking element 1002 may remove a portion of the dummy gate electrode layer 216 from the dummy gate structure 212 in the NFET region 206.

Figure 12:
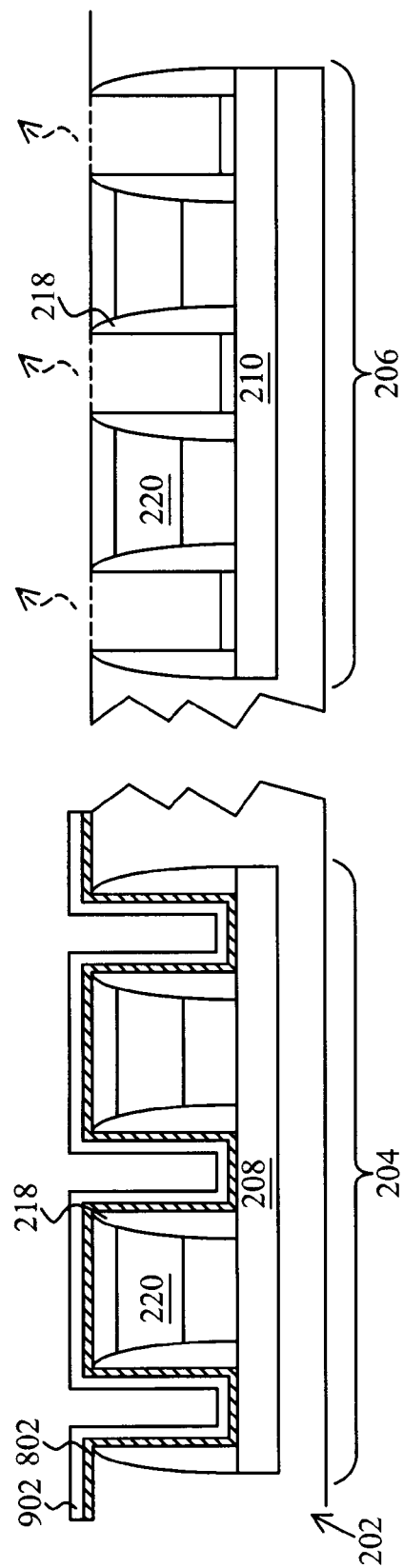
Figure 13:
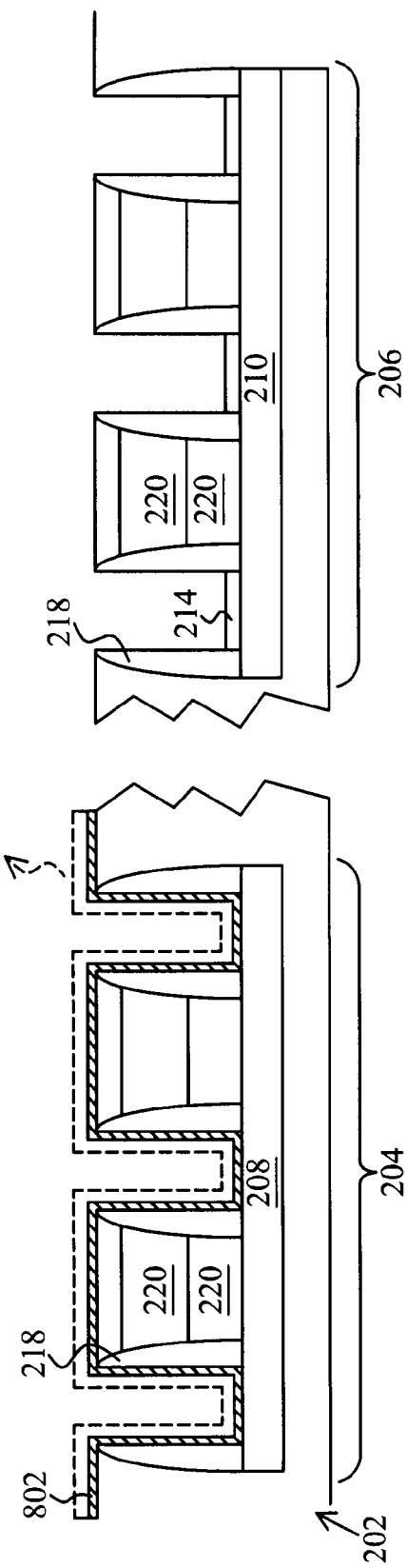

Continuing to the example of FIG. 12, the dummy gate electrode 216 is removed from the NFET region 206 of the substrate 202. It is noted that the dummy layer 902 protects the capping layer 802 on the PFET region 204 of the substrate 202 during the removal of the dummy gate electrode 216.

The method 100 then proceeds to block 116 where the dummy layer is removed from the substrate. In an embodiment, the dummy layer is removed by a suitable wet etch process. However, other etching processes are possible. Referring to the example of FIG. 13, the dummy layer 902 is removed from the substrate 202 including the PFET region 204.

Continuing to the example of FIG. 14, the dummy dielectric 214 of the dummy gate structure 212 formed in the NFET region 206 of the substrate 202 may be removed. In other embodiments, the dummy dielectric may be removed prior to removing the dummy layer 902. In still other embodiments, the dielectric layer may remain on the substrate in the final NFET device. The removal of the dummy gate structure 212 in the PFET region 206 provides a trench 1402.

The method 100 then proceeds to block 118 where a gate dielectric layer is formed on the substrate. The gate dielectric layer may include an interface layer and a high-k dielectric layer. The interface layer may be a gate dielectric layer such as $SiO_2$, $Al_2O_3$, and/or other suitable material. The interface layer may be provided by thermal oxidation, chemical oxidation, and/or other suitable processes. In an embodiment, the gate dielectric layer includes a high-k dielectric layer such as hafnium oxide ($HfO_2$). Alternatively, the high-k dielectric layer may optionally include other high-k dielectrics, such as $TiO_2$, $HfZrO$, $Ta_2O_3$, $HfSiO_4$, $ZrO_2$, $ZrSiO_2$, combinations thereof, or other suitable material. The dielectric layer may be formed by ALD and/or other suitable methods.

Referring to the example of FIG. 15, a gate dielectric layer 1502 is formed on the substrate 202 including in trenches 1402 and 702. The gate dielectric layer 1502 may be formed directly on the capping layer 802 in the PFET region 204. In an embodiment, the gate dielectric layer 1502 includes a high-k dielectric material. In an embodiment, the gate dielectric layer 1502 includes an interface layer and a high-k dielectric layer.

The method 100 then proceeds to block 120 where the remaining gate structure is formed on the gate dielectric layer. The gate structure may include a metal gate electrode, and thus, be referred to as a metal gate structure. The metal gate structure may include a plurality of layers such as, for example, the gate dielectric layer (described above), barrier layer(s), work function metal layer(s), filling layer(s), and/or other suitable layers. The metal gate structures may be include different compositions of materials in the PFET region than the NFET region depending on the desired work function.

FIGS. 16-27 are exemplary of a process flow forming a metal gate structure for the PFET and NFET devices. However, these cross-sections are exemplary, and not intended to be limiting except as defined in the claims provided hereto. One of ordinary skill in the art would recognize other metal gate structures that would benefit from the present disclosure.

FIG. 16 illustrates a deposition of a barrier layer 1602. In an embodiment, the barrier layer is TiN. Continuing to FIG. 17, illustrated is the deposition of a second barrier layer 1604. In an embodiment, the second barrier layer 1604 is TaN. Barrier layers 1602 and 1604 may provide a composite barrier layer.

Figure 18:
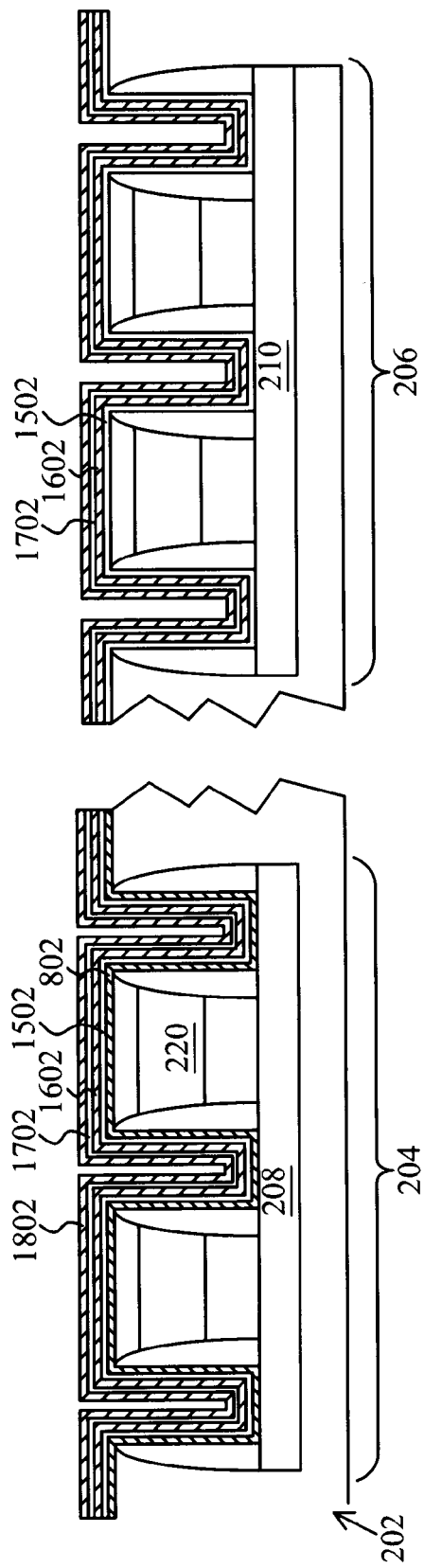

Continuing now to FIG. 18, a first work function metal 1802 is formed. The first work function metal may be a p-type work function metal. In an embodiment, the first work function metal 1802 is TiN. However, other suitable compositions are possible including exemplary p-type work function metals such as TiN, TaN, Ru, Mo, Al, WN, $ZrSi_2$, $MoSi_2$, $TaSi_2$, $NiSi_2$, WN, and/or combinations thereof. The work function layer 1802 may be deposited by CVD, PVD, ALD, and/or other suitable processes.

Figure 19:
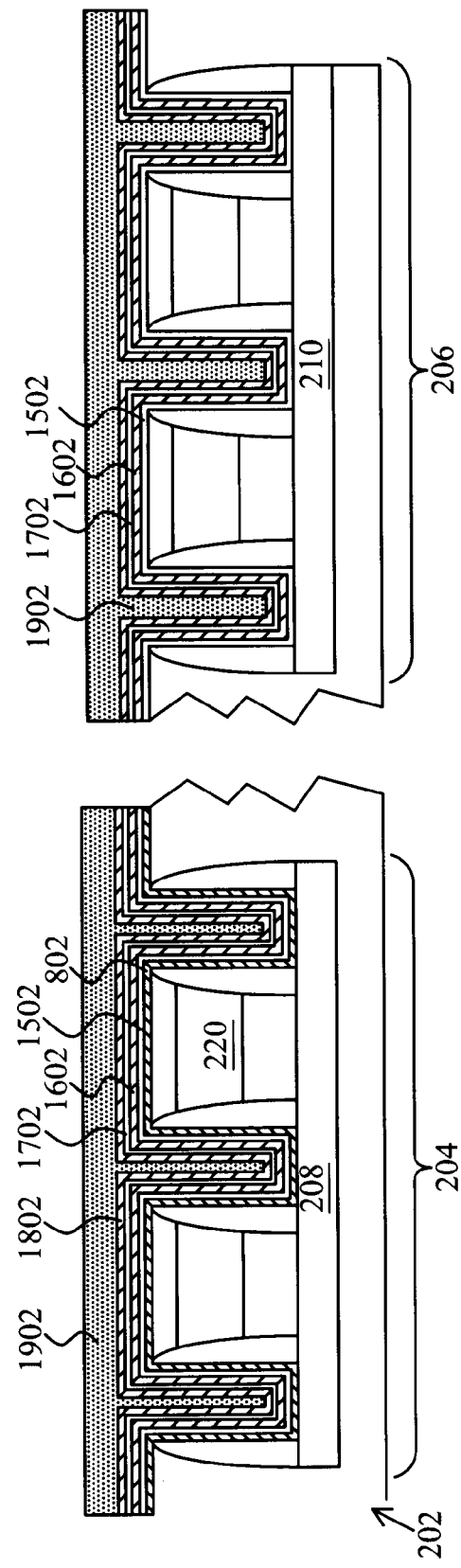
Figure 26:
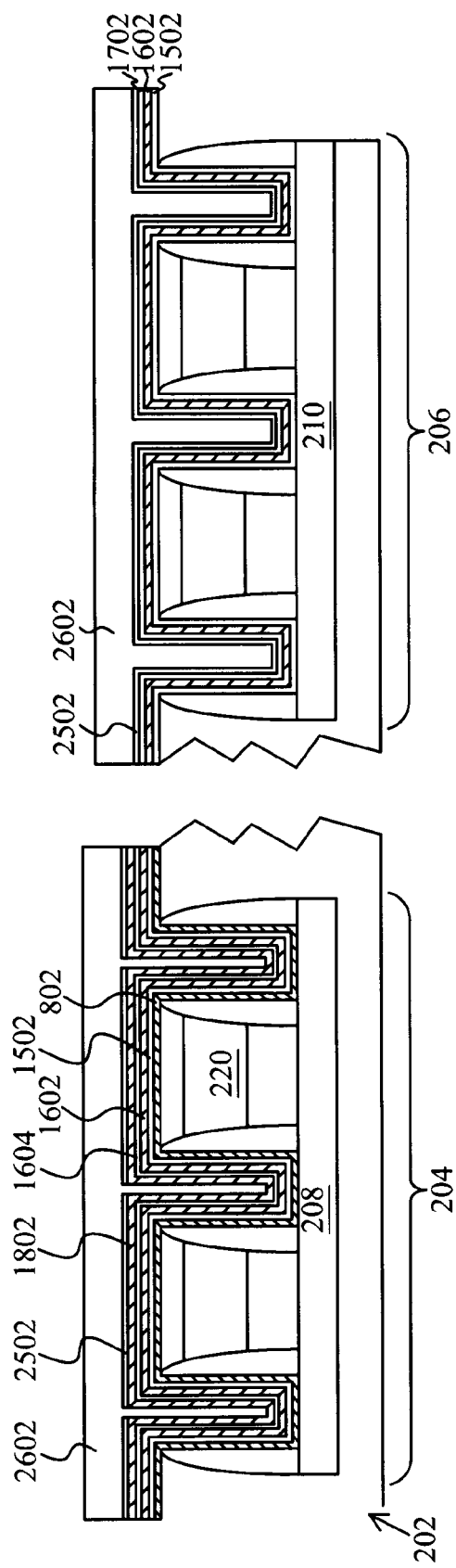

Continuing now to FIG. 19, a spin-on glass (SOG) 1902 is formed on the substrate 202. Other compositions of the SOG 1902 may be possible such that suitable protection of the PFET region 204 is provided during the formation of the NFET metal gate as described below. Referring now to FIG. 20, illustrated is a masking element 2000 formed on the SOG 1902 on the PFET region 204. The masking element 2000 may include a photosensitive material formed by suitable patterning processes such as typical lithography processes of exposure, baking, development, etc.

Continuing now to FIG. 21, while the masking element 2000 protects the PFET region 204, the SOG 1902 is removed from the NFET region 206 of the substrate 202. The SOG 1902 may be removed by a dry etch process and/or other suitable removal process. In a subsequent step, such as illustrated in FIG. 22, the first work function metal (e.g., p-type work function metal) 1802 is removed from the NFET region 206. The masking element 2000 may then be removed from the substrate 202 such as illustrated in FIG. 23. The masking element 2000 may be removed by an ashing process and/or other suitable process.

Continuing now to FIG. 24, the SOG layer 1902 may be removed from the substrate 202 such that the n-type work function metal may be formed on the NFET region 204 of the substrate 202. As illustrated in FIG. 25, the second type of work function metal (e.g., n-type work function material) 2502 is formed on the substrate 202. In an embodiment, the second type of work function metal 2502 is TaN. However, other suitable metals are possible including for example n-type work function metals such as Ti, Ag, TaAl, TaAlC, TiAlN, TaC, TaCN, TaSiN, Mn, Zr, or combinations thereof. The work function layer 2502 may be deposited by CVD, PVD, ALD, and/or other suitable processes.

After formation of the work function metal layers, a fill metal may be formed in the remainder of the trench. A fill layer may include Co—Al, Al, W, or Cu and/or other suitable materials. The fill metal may be formed by CVD, PVD, plating, and/or other suitable processes. Referring to the example of FIG. 26, fill metal 2602 is disposed on the substrate 202.

In a subsequent process, the substrate is planarized to form the metal gate structures. Referring to the example of FIG. 27, a planarized surface 2702 is provided forming metal gate structure 2704 in the PFET region 204 of the substrate 202 and metal gate structure 2706 in the NFET region 206 of the substrate 202. The metal gate structure 2704 is a gate structure for a PFET device. The metal gate structure 2704 includes the capping layer 802, the gate dielectric layer 1502, barrier layers 1602, 1604, work function layer 1802, work function layer 2502 and/or the fill layer 2602. The metal gate structure 2706 is a gate structure for an NFET device. The metal gate structure 2706 includes the gate dielectric layer 1502, barrier layers 1602, 1604, work function layer 2502 and/or the fill layer 2602.

Figure 27:
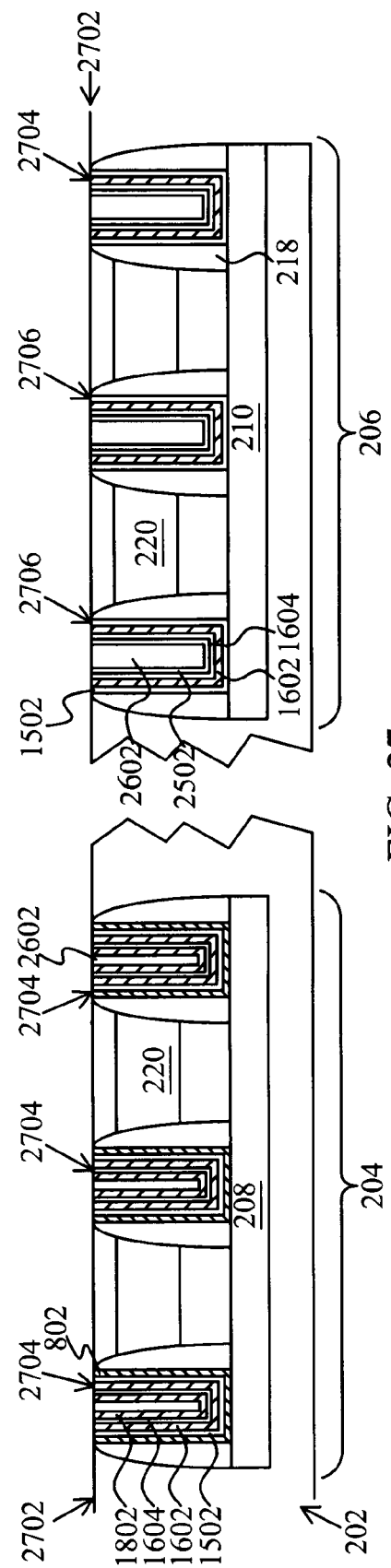

It is again noted that metal gate structures of FIG. 27 are exemplary only and not intended to be limiting. Other metal gate structures may be formed using one or more aspects of the present disclosure. For example, other PFET device gate structures may be formed including a capping layer, while the corresponding NFET device gate structures may not include a capping layer.

In summary, the methods and devices disclosed herein provide for semiconductor devices having a capping layer to improve performance on a first type of semiconductor device (e.g. a PFET device), while the layer is omitted from the second type of semiconductor device (e.g., an NFET device) formed on the substrate. In doing so, the present disclosure offers several advantages over prior art devices. Advantages of embodiments of the present disclosure provide for enhancing the performance of the PFET device by allowing a capping layer to provide a stress to a channel region of the device. Another advantage of some embodiments is that the removal or omitting of the capping layer on the NFET device avoids degradation of performance of the NFET device. Embodiments include depositing a protective layer or hard mask material (e.g., an oxide/nitride layer), performing a photolithography process to pattern the protective layer, and the eventual removal of said layer. The protective layer may protect regions of the NFET from the formation of the capping layer, and/or allow the capping layers efficient and effective removal from the NFET region of the substrate. It is understood that different embodiments disclosed herein offer different disclosure, and that they may make various changes, substitutions and alterations herein without departing from the spirit and scope of the present disclosure.

In one of the embodiments discussed herein a method of semiconductor device fabrication includes forming a first dummy gate structure in a first region of a semiconductor substrate and forming a second dummy gate structure in a second region of the semiconductor substrate. A protective layer (e.g., oxide and/or silicon nitride hard mask) is formed on the second dummy gate structure. The first dummy gate structure is removed after forming the protective layer, thereby providing a first trench. A capping layer is formed in the first trench.

In a further embodiment, the protective layer is removed from the second dummy gate structure after forming the capping layer. In an embodiment, a dummy layer (e.g., silicon nitride) is formed on the capping layer prior to removing the protective layer on the second dummy gate structure.

Forming the capping layer may include forming the capping layer on the protective layer on the second dummy gate structure, for example, as well as in the first trench. In an embodiment, the protective layer and the second dummy gate structure are removed. A metal gate structure is formed in the first trench and in a second trench (provided by the removing the second dummy gate structure).

In a further embodiment, forming the capping layer includes forming a silicon layer. This may include an epitaxial process. In an embodiment, the first dummy gate structure is formed on a silicon germanium portion of the semiconductor substrate. In a further embodiment, the second dummy gate structure is formed on a silicon portion of the semiconductor substrate.

In yet another of the broader forms of the embodiments discussed herein, a method of semiconductor device fabrication includes forming a first dummy gate structure in a p-type field effect transistor (PFET) region and a second dummy gate structure in an n-type field effect transistor (NFET) region of a substrate. A protective layer is formed on the second dummy gate structure. The first dummy gate structure may be removed after forming the protective layer, thereby providing a first trench. A silicon capping layer is formed in the first trench. A metal gate structure is formed on the silicon capping layer in the first trench.

In a further embodiment, the protective layer is formed on the NFET and PFET regions of the substrate and then, using a photolithography process, the protective layer is patterned such that it is removed from the PFET region of the substrate. The protective layer includes depositing at least one of an oxide and a silicon nitride layer.

In an embodiment, the silicon capping layer is formed by an epitaxy process. The epitaxy process may grow a silicon layer on a silicon germanium portion of the PFET region of the substrate. The silicon capping layer may provide a stress to a channel region of a PFET device formed in the PFET region, and thus, may enhance performance.

In yet another of the broader forms of the methods discussed herein, a silicon capping layer is formed on a channel region of a PFET device and on a dummy gate structure of a NFET device. A dummy layer of dielectric material is formed on the silicon capping layer. The silicon capping layer and the dummy layer are patterned such that the silicon capping layer and the dummy layer from the dummy gate structure of the NFET device. The dummy gate structure of the NFET device is removed after the patterning, the removing the dummy gate structure provides a trench. A metal gate structure is then formed on the silicon capping layer to form a gate of the PFET device. Another metal gate structure in the trench may be formed in trench to form a gate of the NFET device.

In an embodiment, forming the dummy layer of dielectric material includes depositing silicon nitride. In a further embodiment, at least one protective layer is formed prior to forming the silicon capping layer. The protective layer may be formed on the dummy gate structure of the NFET device. In a further embodiment, a dummy gate structure of the PFET device is removed to expose the channel region prior to forming the silicon capping layer. At least one protective layer masks the dummy gate structure of the NFET device during the removing of the dummy gate structure of the PFET device. The forming the metal gate structure on the silicon capping layer may includes forming a dielectric layer (e.g., a gate dielectric such as a interface layer or high-k dielectric) directly on the silicon capping layer.

What is claimed is:

1. A method of semiconductor device fabrication, comprising:
    forming a first dummy gate structure in a first region of a semiconductor substrate;
    forming a second dummy gate structure in a second region of the semiconductor substrate;
    forming a protective layer over the second dummy gate structure;
    removing the first dummy gate structure while the protective layer is disposed over the second dummy structure, wherein the removing the first dummy gate structure provides a first trench;
    forming a capping layer in the first trench, while the protective layer is disposed over the second dummy structure.

2. The method of claim 1, further comprising:
    removing the protective layer on the second dummy gate structure after forming the capping layer.

3. The method of claim 2, further comprising:
    forming a dummy layer on the capping layer prior to removing the protective layer on the second dummy gate structure;
    removing the dummy layer prior to forming a metal gate structure on the capping layer.

4. The method of claim 1, wherein the forming the capping layer includes forming the capping layer on the protective layer on the second dummy gate structure.

5. The method of claim 1, further comprising:
    removing the protective layer and the second dummy gate structure after forming the capping layer; and
    forming metal gate structures in each of the first trench on the capping layer and in a second trench provided by the removing of the second dummy gate structure.

6. The method of claim 1, wherein the forming the capping layer includes forming a silicon layer.

7. The method of claim 6, wherein the forming the capping layer includes an epitaxial process.

8. The method of claim 1, wherein the first dummy gate structure is formed directly on a silicon germanium portion of the semiconductor substrate.

9. The method of claim 8, wherein the second dummy gate structure is formed directly on a silicon portion of the semiconductor substrate, wherein the silicon germanium portion and the silicon portion are coplanar.

10. A method of semiconductor device fabrication, comprising:
    forming a first dummy gate structure in a p-type field effect transistor (PFET) region and a second dummy gate structure in an n-type field effect transistor (NFET) region of a substrate;
    forming a protective layer on the second dummy gate structure;
    removing the first dummy gate structure thereby providing a first trench, while the protective layer is disposed on the second dummy gate structure;
    forming a silicon capping layer in the first trench, while the protective layer is disposed on the second dummy gate structure;
    forming a metal gate structure on the silicon capping layer in the first trench; and
    removing the protective layer from the second dummy gate structure before removing the second dummy gate structure.

11. The method of claim 10, wherein the forming the protective layer includes forming the protective layer on the NFET and PFET regions of the substrate; and
    using a photolithography process, patterning photosensitive material to form a masking element; and using the masking element to pattern the protective layer such that the protective layer is removed from the PFET region of the substrate.

12. The method of claim 10, wherein the forming the protective layer includes depositing at least one of an oxide and a silicon nitride layer.

13. The method of claim 10, wherein the forming the silicon capping layer includes an epitaxy process.

14. The method of claim 13, wherein the epitaxy process grows a silicon layer on a silicon germanium portion of the PFET region of the substrate.

15. The method of claim 10, wherein the silicon capping layer provides a stress to a channel region of a PFET device formed in the PFET region.

16. A method of semiconductor device fabrication, comprising:
    forming a first dummy gate structure in a p-type field effect transistor (PFET) region and a second dummy gate structure in an n-type field effect transistor (NFET) region of a substrate;
    forming a protective layer over the second dummy gate structure;
    removing the first dummy gate structure while the protective layer is disposed over the second dummy gate structure, thereby providing a first trench;

epitaxially growing a silicon capping layer in the first trench;

after growing the silicon capping layer, removing the protective layer from over the second dummy gate structure; and after removing the protective layer, removing the second dummy gate structure.

17. The method of claim 16, wherein the forming the protective layer includes forming the protective layer on the NFET and PFET regions of the substrate; and depositing a photosensitive layer on the protective layer, and using a photolithography process, defining a masking element in the photosensitive layer; and patterning the protective layer using the masking element such that the protective layer is removed from the PFET region of the substrate.

18. The method of claim 16, wherein the forming the protective layer includes depositing at least one of an oxide layer and a silicon nitride layer.

19. The method of claim 16, wherein the forming the silicon capping layer includes growing a substantially pure silicon layer.

20. The method of claim 19, wherein the epitaxy process grows a silicon layer on a silicon germanium portion of the PFET region of the substrate.

* * * * *